United States Patent
Yang et al.

(10) Patent No.: US 10,290,730 B1
(45) Date of Patent: May 14, 2019

(54) SEMICONDUCTOR POWER DEVICE

(71) Applicant: EPISTAR CORPORATION, Hsinchu (TW)

(72) Inventors: Ya-Yu Yang, Hsinchu (TW); Yu-Jiun Shen, Hsinchu (TW); Chia-Cheng Liu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 15/951,184

(22) Filed: Apr. 12, 2018

(51) Int. Cl.
*H01L 21/02* (2006.01)
*H01L 29/778* (2006.01)
*H01L 29/205* (2006.01)
*H01L 29/20* (2006.01)
*H01L 29/66* (2006.01)

(52) U.S. Cl.
CPC ...... *H01L 29/7786* (2013.01); *H01L 21/0254* (2013.01); *H01L 21/02389* (2013.01); *H01L 21/02458* (2013.01); *H01L 29/2003* (2013.01); *H01L 29/205* (2013.01); *H01L 29/66431* (2013.01)

(58) Field of Classification Search
CPC ........... H01L 29/7786; H01L 21/02389; H01L 21/02458; H01L 21/0254; H01L 29/2003; H01L 29/205
USPC ........................................................ 257/194
See application file for complete search history.

(56) References Cited

U.S. PATENT DOCUMENTS

2014/0061665 A1 3/2014 Tsuchiya
2015/0028346 A1 1/2015 Palacios

FOREIGN PATENT DOCUMENTS

TW 201508915 A 3/2015

*Primary Examiner* — Elias Ullah
(74) *Attorney, Agent, or Firm* — Ding Yu Tan

(57) ABSTRACT

A semiconductor power device includes an engineered aluminum-nitride substrate structure, and method of fabricating the same are described. The engineered substrate structure is effectively integrated with a transition layer of AlN/AlGaN disposed thereon, a buffer layer disposed on the transition layer having a C—(Al)GaN/u-GaN multiple stacking layered structure, a channel layer, a barrier layer, and an optional $SiN_x$ interlayer together, to form a GaN-based semiconductor power device. The GaN buffer layer is capable of achieving sufficient thickness for higher performance. The engineered substrate structure has a core region made of an aluminum nitride (AlN) substrate, a single crystal silicon layer as top material layer thereof, and bonded together with an encapsulated multi-layered structure containing adhesive layers, thin film layers and the AlN substrate. Higher breakdown voltage and improved overall device quality with respect to epitaxy-induced bow, warp, and cracking issues are achieved by the semiconductor power device.

14 Claims, 21 Drawing Sheets

SEMICONDUCTOR POWER DEVICE

BACKGROUND OF THE INVENTION

The present invention is related to a semiconductor power device, and more particularly, to a gallium nitride (GaN) based wide-band gap power device on engineered aluminum-nitride (AlN) based silicon-on-insulator substrate and method of fabricating the same.

DESCRIPTION OF THE PRIOR ART

GaN power devices are mainly used in power circuits when used as power switches because of their high temperature resistance, high blocking voltage capability, high efficiency, low on-resistance, high current density and high operating frequency. Due to having multitude of advantages over conventional second generation silicon and GaAs based semiconductor devices, GaN power devices are becoming popular in usages in high power and high frequency applications. The above advantages are typically due to the fact that GaN materials are generally grown on substrates such as, sapphire substrates ($Al_2O_3$), silicon substrates (Si), or silicon carbide substrates (SiC). Taking heavily into account of cost and device performance considerations, most conventional high-power semiconductor devices are epitaxially grown on the Si substrate. However, due to the lattice-mismatch and the difference in thermal expansion coefficient between the GaN layer and the Si substrate are both very large, therefore cracks are formed during growth process of the GaN layer, as well as producing large warpage or bow in larger size wafers which is considered a serious problem. Based on above issues, it is quite understandable why proper substrate selection becomes very important when designing improved wide band-gap semiconductor power devices for use in power applications, and in turn, improved engineered AlN based semiconductor-on-insulator substrate becomes a viable solution as one of the desired substrate selection choice, beyond that of conventional substrates (i.e. silicon or sapphire substrates) for epitaxially growing GaN-based material, for fabricating a GaN-based HEMT (High Electron Mobility Transistor). Typically, a conventional GaN-based HEMT can be formed by confining carriers in a two-dimensional electron gas (2 DEG). Carrier confinement is conventionally achieved by forming a material with a higher bandgap on a material of lower bandgap. GaN-based HEMT devices have been formed using a buffer layer of undoped GaN (u-GaN) with an overlying layer of aluminum gallium nitride (AlGaN) of a higher bandgap than GaN. The 2 DEG is formed in the buffer layer of u-GaN at the interface between the buffer layer and the AlGaN overlying layer. During typical operation, a voltage applied to the gate of the GaN-based HEMT modulates the two-dimensional electron gas (2 DEG) which serves and acts as a channel region of the HEMT. Besides, the remaining part of the GaN buffer layer is required in order to prevent leakage current through the substrate and to release strain coming from the lattice mismatch. This buffer layer is composed of C-doped, Fe-doped, or a superlattice structure, which also blocks the vertical current path. Meanwhile, stress of the GaN buffer layer on the Si substrate can be controlled using an AlGaN/GaN superlattice structure therein.

Although the above-mentioned improved engineered AlN based semiconductor-on-insulator substrate seems very promising, there have been limited amount of information regarding its successful adaptation and implementation with regards to GaN power devices, thus much work or research are needed in this technical field for providing commercial available solutions for GaN power devices.

SUMMARY OF THE INVENTION

An object of the present invention is to provide a semiconductor power device including an engineered aluminum-nitride based silicon-on-insulator substrate adapted for usages in high power and high frequency applications.

Another object of the present invention is to provide a method for fabricating the semiconductor power device including an engineered AlN based silicon-on-insulator substrate adapted for usages in high power and high frequency applications.

To achieve one or more of the objects, in one embodiment of the present invention, a semiconductor power device, which includes an engineered substrate structure; a transition layer disposed on the engineered substrate structure; a buffer layer disposed on the transition layer; a channel layer disposed on the buffer layer; a barrier layer disposed on the channel layer; and a gate, a source, and a drain disposed on the barrier layer, is provided.

In the aforementioned semiconductor power device, the engineered substrate structure includes a core region of a substrate; a thin film layer disposed on the core region; a bonding layer coupled to at least a portion of the thin film layer; an adhesive layer disposed between the core region and the thin film layer; and a single crystal silicon layer coupled to the bonding layer.

In the aforementioned semiconductor power device, the buffer layer includes an u-GaN layer and a plurality of carbon-doped (Al)GaN (C—(Al)GaN) interlayers disposed within the u-GaN layer.

In the aforementioned semiconductor power device, the gate, the source and the drain are disposed above the barrier layer, respectively.

In the aforementioned semiconductor power device, the transition layer can be a constant-composition epitaxial layer of aluminum gallium nitride ($Al_{x1}Ga_{1-x1}N$), and $0<X\le1$.

In the aforementioned semiconductor power device, the transition layer can be a graded-composition epitaxial layer of aluminum gallium nitride ($Al_{x1}Ga_{1-x1}N$) and aluminum gallium nitride ($Al_{x2}Ga_{1-x2}N$) sublayers, and $0<X1, X2\le1$.

In the aforementioned semiconductor power device, the substrate in the core region of the engineered substrate structure is made of aluminum nitride (AlN).

In the aforementioned semiconductor power device, a silicon nitride ($SiN_x$) interlayer can be disposed between the buffer layer and the transition layer.

In the aforementioned semiconductor power device, the barrier layer is made of AlGaN with an aluminum (Al) composition content between 20% and 28%, and a GaN cap layer is disposed on the barrier layer.

To achieve one or more of the objects, a method for fabricating a semiconductor power device according to the embodiment of the present invention includes following steps: (a) providing an engineered substrate structure, wherein the engineered substrate structure includes a core region including a substrate; a thin film layer disposed on the core region; a bonding layer coupled to at least a portion of the thin film layer; an adhesive layer disposed between the core region and the thin film layer; and a single crystal silicon layer coupled to the bonding layer; (b) growing a transition layer on the engineered substrate structure epitaxially; (c) growing a buffer layer on the transition layer sequentially and epitaxially, wherein the buffer layer includes a u-GaN sublayer and a plurality of C—AlGaN/u-

GaN interlayer, wherein a thickness of one of the u-GaN interlayers in the buffer layer is larger than 1 micrometers (μm), and a thickness of one of the C—AlGaN interlayers is between 30 nanometers (nm) and 200 nanometers (nm); (d) growing a channel layer on the buffer layer epitaxially, wherein the channel layer is made of u-GaN; (e) forming a barrier layer on the channel layer, wherein the barrier layer is made of AlGaN with an aluminum (Al) composition content between 20% and 28% and has a thickness between 18 nm and 30 nm; and (f) forming a gate, a source and a drain, respectively above the barrier layer.

In the aforementioned method for fabricating the semiconductor power device, the C—(Al)GaN/u-GaN interlayers of the buffer layer comprising at least one C—(Al)GaN interlayer and at least one u-GaN interlayer formed sequentially, and the at least one C—(Al)GaN interlayer is formed by using carbon tetrabromide ($CBr_4$) gas source in an in-situ manner.

In the aforementioned method for fabricating the semiconductor power device, the transition layer can be a constant-composition epitaxial layer made of AlGaN, or a graded-composition epitaxial layer comprising $Al_{x1}Ga_{1-x1}N$ and $Al_{x2}Ga_{1-x2}N$ sublayers, and wherein 0<x1, x2≤1.

Advantages of the semiconductor power device according to embodiments of the present invention include the following:
1. achieving reduced thermal expansion (CTE) mismatch between the engineered substrate structure and various materials layers comprising of GaN disposed thereon;
2. being compatible with thicker GaN epitaxy layer of up to 12 μm so as to achieve higher vertical breakdown voltage;
3. achieving improved a breakdown voltage of 2100 volts versus conventional comparable device which possesses a breakdown voltage of just 650 volts;
4. achieving much improved overall device quality with respect to epitaxy-induced bow, warp, and cracking issues that are associated with conventional GaN power devices;
5. as shown by x-ray diffraction (XRD) rocking curves data results in both (002) and (102) planes, the full width at half maximum (FWHM) of the (0002) is about 255 arcsec, the FWHM of the (102) is about 300 arcsec over conventional results of the FWHM of the (002) is 450 arcsec, the FWHM of the (102) is 700 arcsec;
6. achieving reduction in horizontal leakage of the finished power semiconductor device through using multiple C—(Al)GaN interlayers in the u-GaN buffer layer; and
7. achieving improved epitaxial crystal quality and dislocation density reduction by adopting a $SiN_x$ interlayer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The present invention is illustrated by way of example and not limited by the figures of the accompanying drawings in which same references indicate similar elements. Many aspects of the disclosure can be better understood with reference to the following drawings. Moreover, in the drawings same reference numerals designate corresponding elements throughout. Wherever possible, the same reference numerals are used throughout the drawings to refer to the same or similar elements of an embodiment.

FIGS. 4-6, 7A-7E, 8, 9, and FIG. 1 are a plurality of cross-sectional views illustrating steps for a method of fabricating a semiconductor power device according to the first embodiment of the present invention.

FIGS. 10-17, and FIG. 2 are a plurality of cross-sectional views illustrating steps for another method of fabricating a semiconductor power device according to the second embodiment of the present invention.

DETAILED DESCRIPTION OF THE PREFERRED EMBODIMENTS

The present invention will now be described more specifically with reference to the following embodiments. It is to be noted that the following descriptions of the embodiments of this invention are presented herein for purpose of illustration and description only. It is not intended to be exhaustive or to be limited to the precise form disclosed.

The techniques described herein may be used to produce semiconductor devices such as transistors, diodes, capacitors, resistors, light emitting diodes, laser diodes, or other devices. Such devices may find various applications, such as power switch applications in which a device needs to be capable of withstanding high voltage and/or current.

Use of ordinal terms such as "first", "second", "third" etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Figure 1:
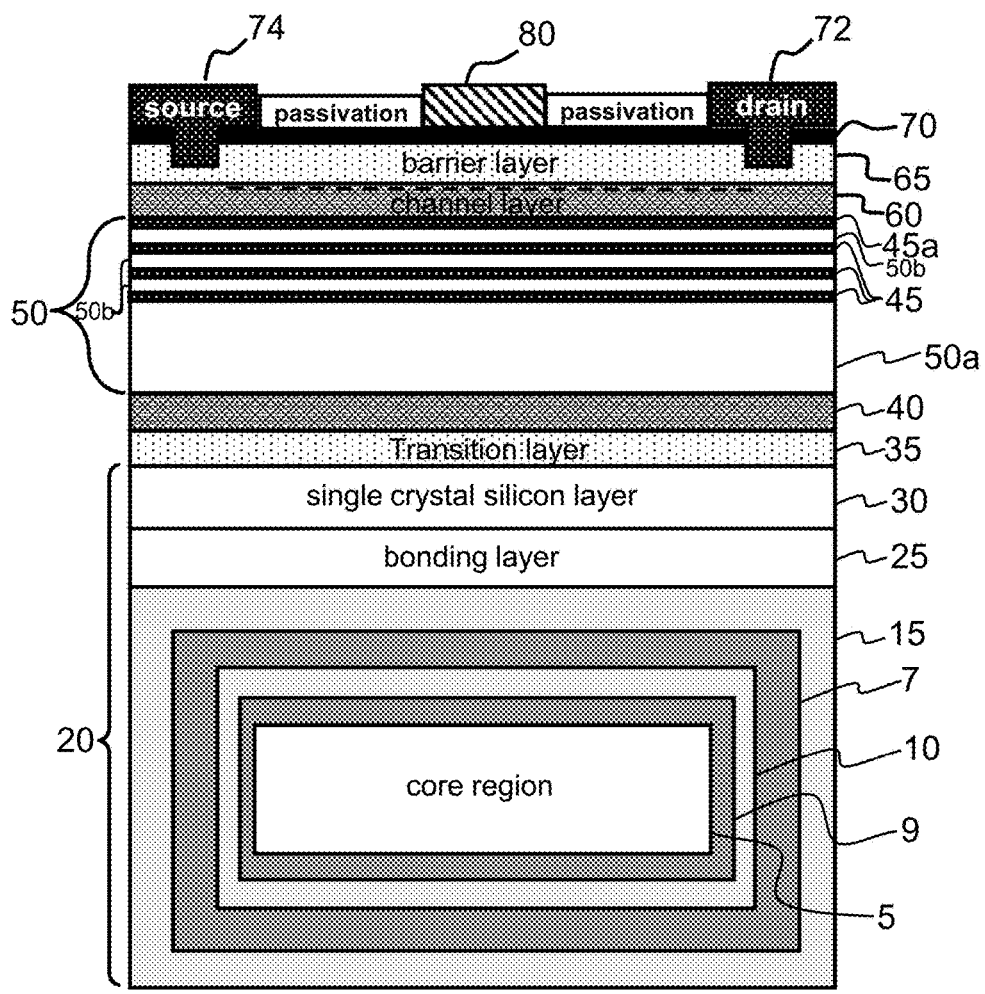
FIG. 1 is a cross-sectional view illustrating structural configuration of a semiconductor power device according to a first embodiment of the present invention.

As shown in FIG. 1, a semiconductor power device 100 according to a first embodiment of the present invention, includes an engineered substrate structure 20, an transition layer 35, a buffer layer 50, a channel layer 60, a barrier layer 65, a gate 80, a source 74, and a drain 72. In addition, the semiconductor power device 100 may further include one or a plurality of passivation layers (not labelled). In the illustrated embodiment, the transition layer 35 is disposed on the engineered substrate structure 20; the buffer layer 50 is disposed on the transition layer 35; the channel layer 60 is formed and disposed on the buffer layer 50; the barrier layer 65 is disposed on the channel layer 60; the gate 80, the source 74, and the drain 72 are disposed above the barrier layer 65 and the channel layer 60, respectively. In the illustrated embodiment, the engineered substrate structure 20 includes a core region 5; a plurality of thin film layers 10, 15; a bonding layer 25; a plurality of adhesive layers 7, 9; and a single crystal silicon layer 30. The buffer layer 50 includes a bulk u-GaN layer and a plurality of interlayers 45 disposed within the bulk u-GaN layer. The bulk u-GaN layer is divided into an u-GaN sublayer and a plurality of u-GaN interlayers 50a, 50b by the interlayers 45. The material of the interlayers 45 includes (aluminum) gallium nitride based material doped with carbon (C—(Al)GaN), such as C—GaN or C—AlGaN. The C—(Al)GaN interlayers 45 are disposed within the buffer layer 50 includes a first C—(Al)GaN interlayer 45a disposed nearest to a top surface of the buffer layer 50 as shown in FIG. 1. One or more C—(Al)GaN interlayers 45 can be disposed below the first C—(Al)GaN interlayer 45a within the buffer layer 50 in an alternate-stacking manner in combination with the u-GaN interlayer(s) 50b. A carbon doping concentration of each of the C—(Al)GaN interlayers 45 is greater than 1E18 atoms/cm$^3$. Furthermore, a distance from a bottom surface of the barrier layer 65 to the top surface of the first C—(Al)GaN interlayer 45a is between 200 nm and 700 nm. A total thickness of the u-GaN sublayer 50a and the plurality of u-GaN interlayers 50b in the buffer layer 50 is larger than 5 µm. In other words, the total thickness of the bulk u-GaN layer is larger than 5 µm. In one embodiment, the total thickness of the u-GaN sublayer 50a and the plurality of u-GaN interlayers 50b of the buffer layer 50 can be between 5 µm and 12 µm, and a thickness of each of the C—(Al)GaN interlayers 45 is between 30 nm and 200 nm. In addition, a distance between any two adjacent C—(Al)GaN interlayers 45 is larger than 1 µm. That is, a thickness of each one of the u-GaN interlayers 50b in the buffer layer 50 is larger than 1 µm. The channel layer 60 is disposed on the first C—(Al) GaN interlayer 45a of buffer layer 50, and the channel layer 60 contains undoped GaN in material composition. The channel layer 60 forms an interface with the barrier layer 65 (an overlying layer, for example, made of AlGaN of a higher bandgap than GaN). The 2 DEG (indicated by a dashed line in the channel layer 60) is formed near the interface between the channel layer 60 and the barrier layer 65. The channel layer 60 has a thickness between 200 nm and 700 nm, and can be disposed on, directly on, or above the first C—(Al) GaN interlayer 45a. In one embodiment, the material of the channel layer 60 is u-GaN which is epitaxially grown in a growing condition the same as the growing condition of growing the u-GaN interlayers 50b of the buffer layer 50. The u-GaN channel layer 60 can be of same material composition as that of the buffer layer 50. During typical operation of the semiconductor power device 100, a voltage applied to the gate 80 of the semiconductor power device 100 modulates the two-dimensional electron gas (2 DEG) which serves and acts as a channel region (in the channel layer 60) of the semiconductor power device 100. In addition, the gate 80, the source 74 and the drain 72 are disposed above the barrier layer 65, respectively.

In one example or embodiment, the transition layer 35 can be a constant-composition epitaxial layer made of $Al_xGa_{1-x}N$, and $0<x\leq1$. Meanwhile, in another example or embodiment, the transition layer 35 can be a graded-composition epitaxial layer composed of $Al_{x1}Ga_{1-x1}N$ and $Al_{x2}Ga_{1-x2}N$ sublayers (not shown), and $0<x1, x2\leq1$. Alternatively, the transition layer 35 can comprise a plurality of group III-nitride layers having graded compositions. In one embodiment, the $Al_{x1}Ga_{1-x1}N$ sublayer is closer to the engineered substrate structure 20 than the $Al_{x2}Ga_{1-x2}N$ sublayer. The Al composition x1 is greater than x2. In one embodiment, the x1 and x2 vary gradually in a direction from the engineered substrate structure 20 to the buffer layer 50. In each of above examples, the transition layer 35 has a thickness less than 500 nm. In the illustrated embodiment of the semiconductor power device 100, a $SiN_x$ interlayer 40, which is optional, is disposed between the buffer layer 50 and the transition layer 35. The $SiN_x$ interlayer 40 can be on the order of 100 nm in thickness. The presence of the $SiN_x$ interlayer 40 helps to achieve improved epitaxial crystal quality and dislocation density reduction using 3D ELOG GaN technique. In addition, the $SiN_x$ interlayer 40 prevents diffusion and/or outgassing of elements present in the engineered substrate structure 20 disposed therebelow, for example, oxygen, metallic impurities, other trace elements, and the like into the environment of the semiconductor processing chambers in which the engineered substrate structure could be present, for example, during a high temperature (e.g., 1,000° C.) epitaxial growth process. Meanwhile, alternatively, an oxide material, such as silicon oxide $SiO_2$ or aluminum oxide $Al_2O_3$, or an oxynitride material such as silicon oxynitride ($SiON_x$) can also be used in lieu of the $SiN_x$ interlayer. The barrier layer 65 is made of AlGaN with an Al composition content between 20% and 28%, and having a thickness between 18 nm and 30 nm. A GaN cap layer 70 having a thickness between 1 nm and 3 nm is disposed on the barrier layer 65 in the illustrated embodiment of FIG. 1.

In the illustrated embodiment of FIG. 1, the engineered substrate structure 20 includes a core region 5; a bonding layer 25; a single crystal silicon layer 30 coupled to the bonding layer 25. The engineered substrate structure 20 can further optionally includes a plurality of thin film layers 10, 15; the bonding layer 25 coupled to at least a portion of the thin film layer 15; a plurality of adhesive layers 7, 9 disposed between the core region 5 and the thin film layers 10, 15, respectively. The engineered substrate structure 20 has a thickness larger than 600 µm. The single crystal silicon layer 30 is typically an exfoliated material layer that is split from a silicon donor wafer using an implant and exfoliation technique. Typical implants used in the implant and exfoliation technique are hydrogen and boron. Alternatively, other substantially single crystal layers can be used including silicon carbide (SiC), sapphire, GaN, AlN, silicon germanium (SiGe), Ge, diamond, gallium oxide ($Ga_2O_3$), zinc oxide (ZnO), and the like. The single crystal silicon layer 30 can be at most 1 µm and at least 50 nm in thickness. The bonding layer 25 (e.g., a silicon oxide layer) having a thickness of 1.5 µm or less, 300 nm or less, 100 nm or less, or 30 nm or less, can be deposited on the core region 5. In one embodiment, the bonding layer 25 is deposited on a top surface of one of the thin film layers 15, which serves the function as a barrier layer, and the bonding layer 25 is subsequently used during the bonding with the single crystal silicon layer 30. The joining of the single crystal silicon layer 30 to the bonding layer 25 can include deposition of a bonding material followed by planarization processes. In an alternative embodiment, the single crystal silicon layer 30 can be joined or bonded to the bonding layer 25 utilizing a layer transfer process in which the transferred layer is a single crystal silicon layer 30 that is transferred from a silicon donor wafer. In the illustrated embodiment, the one thin film layer 15, serving as the barrier layer, as described above, is formed completely surrounding one of the adhesive layers 7 so as to form an overall encapsulated structure using an LPCVD process. The one thin film layer 15 can have a thickness on the order of 4,000 Å to 5,000 Å. The core region 5 in the engineered substrate structure 20 includes a substrate made of aluminum nitride (AlN) or a ceramic material, for example, such as polycrystalline AlN, which can include a binding material such as yttrium oxide. Other materials can be utilized in the core region 5, including gallium nitride (GaN), aluminum gallium nitride (AlGaN), silicon carbide (SiC), zinc oxide (ZnO), gallium trioxide ($Ga_2O_3$), and the like. The thickness of the core region 5 can be on the order of 100 µm to 1,500 µm, for example, 725 µm. The core region 5 is encapsulated in one adhesive layer 9. Each of the adhesive layers 7, 9 comprises a tetraethyl orthosilicate (TEOS) layer on the order of 1,000 Å in thickness. In other embodiments, the thickness of the each of the adhesive layers 7, 9 varies, for example, from 100 Å to 2,000 Å. Although TEOS is utilized for adhesive layers 7, 9 in some embodiments, other materials that provide for adhesion between later deposited layers and underlying layers or materials (e.g., ceramics, in particular, polycrystalline ceramics) can be utilized just as well. Each of the respective adhesive layers 7, 9 completely surrounds the core region 5 as shown in the illustrated embodiment to form a fully encapsulated multi-layered structure, and can be formed using an LPCVD process. One of the thin film layer 10 is a conductive layer, and is formed surrounding the adhesive layer 9 in an encapsulating manner by using an LPCVD process. In the illustrated embodiment, the thin film layer 10 (the conductive layer) is a shell of polysilicon (i.e., polycrystalline silicon) that is formed surrounding the adhesive layer 9 since polysilicon can exhibit poor adhesion to ceramic materials. The thickness of the thin film layer 10 made of polysilicon can be on the order of 500 Å-5,000 Å. The adhesive layer 7 (e.g., a TEOS layer on the order of 1,000 Å in thickness) is formed (completely) surrounding the thin film layer 10 (conductive layer) to form a fully encapsulated structure using an LPCVD process, a CVD process, or any other suitable deposition process, including the deposition of a spin-on dielectric. The thin film layer 15 serving as a barrier layer, for example, comprising of $SiN_x$, is formed surrounding the adhesive layer 7. The thin film layer 15 is on the order of 4,000 Å to 5,000 Å in thickness. The another thin film layer 15 can completely surround the adhesive layer 7 in some embodiments to form a fully encapsulated structure, and can be formed using an LPCVD process. In addition to $SiN_x$, amorphous materials including SiCN, SiON, AlN, SiC, and the like can be utilized as the thin film layer 15.

Figure 4:
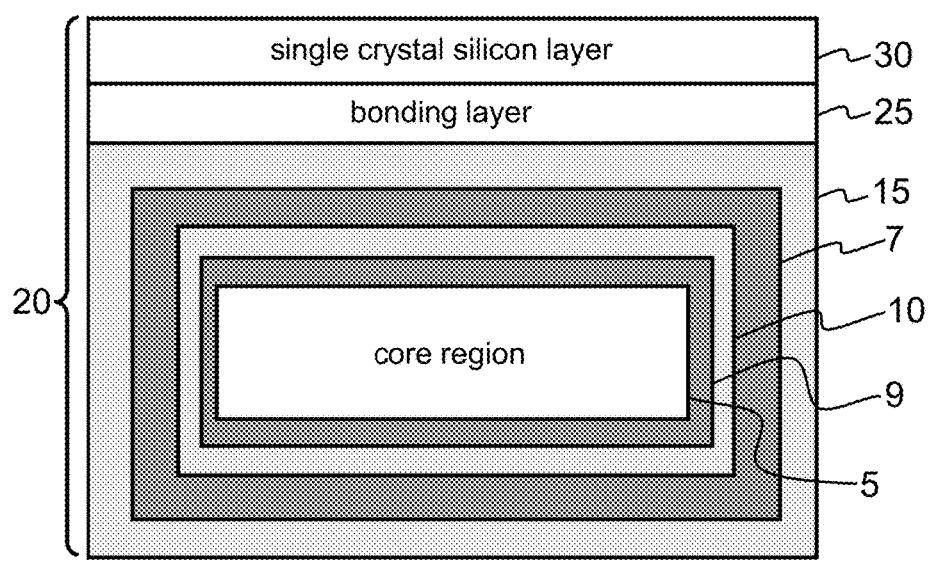

Referring to FIGS. 4-9, and FIG. 1, a method for fabricating the semiconductor power device 100 is shown, which includes the following steps: In step (a) as shown in FIG. 4, an engineered substrate structure 20 is provided as an integral (turnkey) pre-fabricated structure, in which the engineered substrate structure 20 includes a core region 5 of a substrate, a plurality of thin film layers 10, 15 disposed on or surrounding the core region 5, a bonding layer 25 coupled to at least a portion of the thin film layers 15, a plurality of adhesive layers 9, 7 disposed between the core region 5 and the thin film layers 10, 15, respectively, and a single crystal silicon layer 30 coupled to the bonding layer 25. The engineered substrate structure 20 can be fabricated and sourced from a commercial specialized substrate provider. The engineered substrate structure 20 has a thickness larger than 600 µm.

Figure 5:
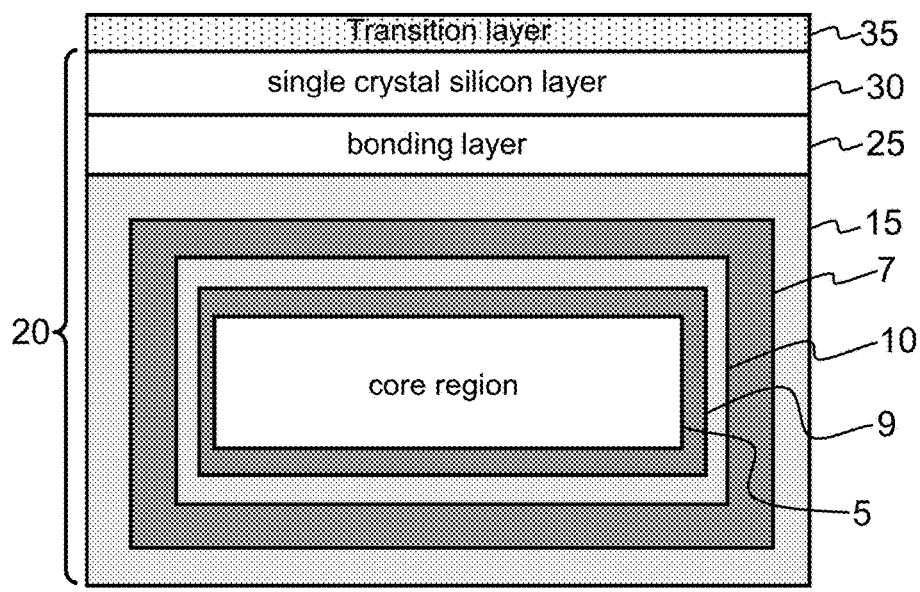

In step (b) as shown in FIG. 5, a transition layer 35 is grown on the engineered substrate structure 20 epitaxially, which involves for example, a high temperature (e.g., 1,000° C.) epitaxial growth process under metal-organic chemical vapor deposition (MOCVD), molecular-beam epitaxy (MBE), hydride vapor phase epitaxy (HVPE), low pressure CVD (LPCVD), atomic layer deposition (ALD), physical vapor deposition (PVD) or the like. The transition layer 35 can be grown either in a constant-composition or a graded-composition according to specified desired semiconductor power device product requirements. During the growth of the constant-composition epitaxial layer of $Al_xGa_{1-x}N$ for the transition layer 35, the aluminum (Al) composition x is set and fixed to be from 0 and less than 1. Please note that x in the growth of the constant-composition epitaxial layer is a fixed value. Meanwhile, during the growth of the graded-composition epitaxial layer of $Al_{x1}Ga_{1-x1}N$ and $Al_{x2}Ga_{1-x2}N$ sublayers for forming the transition layer 35, the aluminum (Al) composition is set accordingly, and 0<x1, x2≤1. Please note that x1 and x2 in the growth of the graded-composition epitaxial layer are not the same value, but are being adjusted in an decreasing manner from the engineered substrate structure 20 side toward the buffer layer 50 side. The transition layer 35 has a thickness less than 500 nm.

Figure 6:
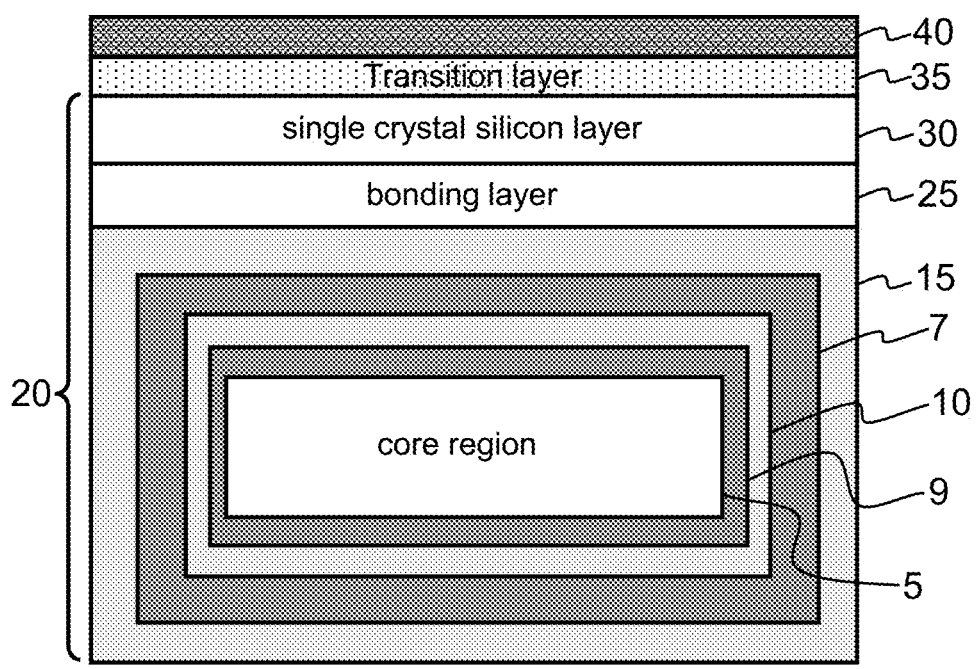

In an optional step in between step (b) and step (c), a $SiN_x$ interlayer 40 of about 100 nm in thickness can be deposited on the transition layer 35 as shown in FIG. 6 using plasma-enhanced chemical vapor deposition (PECVD).

Figure 7A:
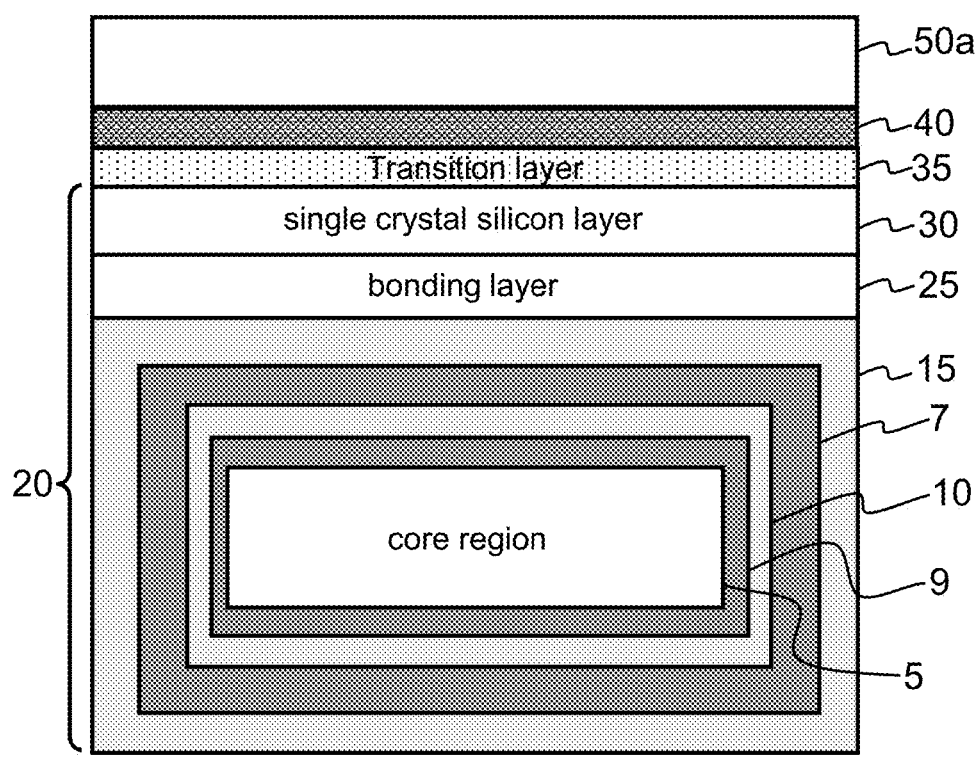
Figure 7B:
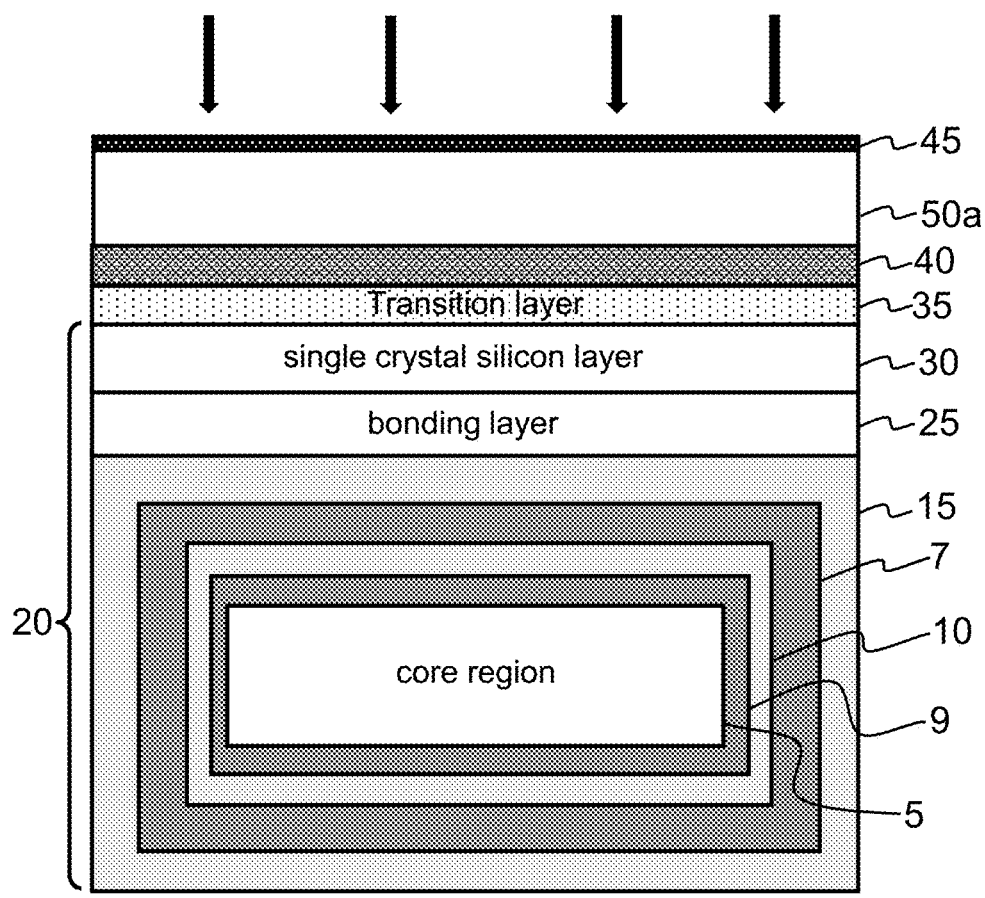
Figure 7C:
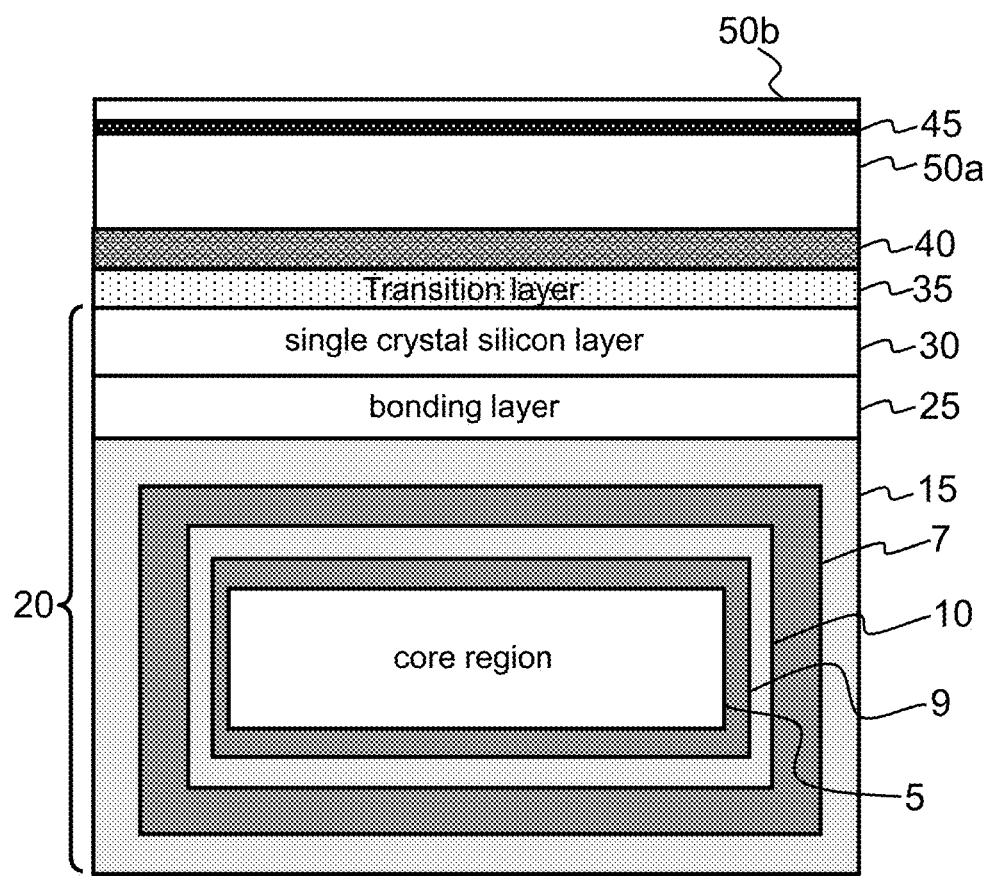
Figure 7D:
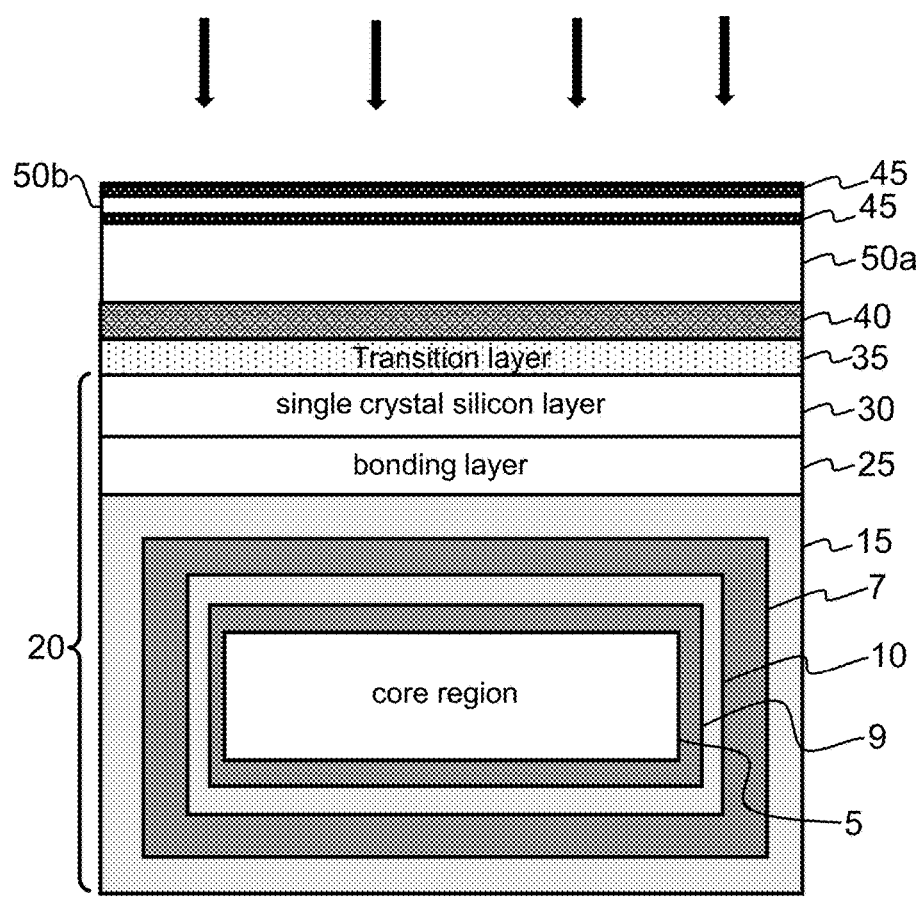
Figure 7E:
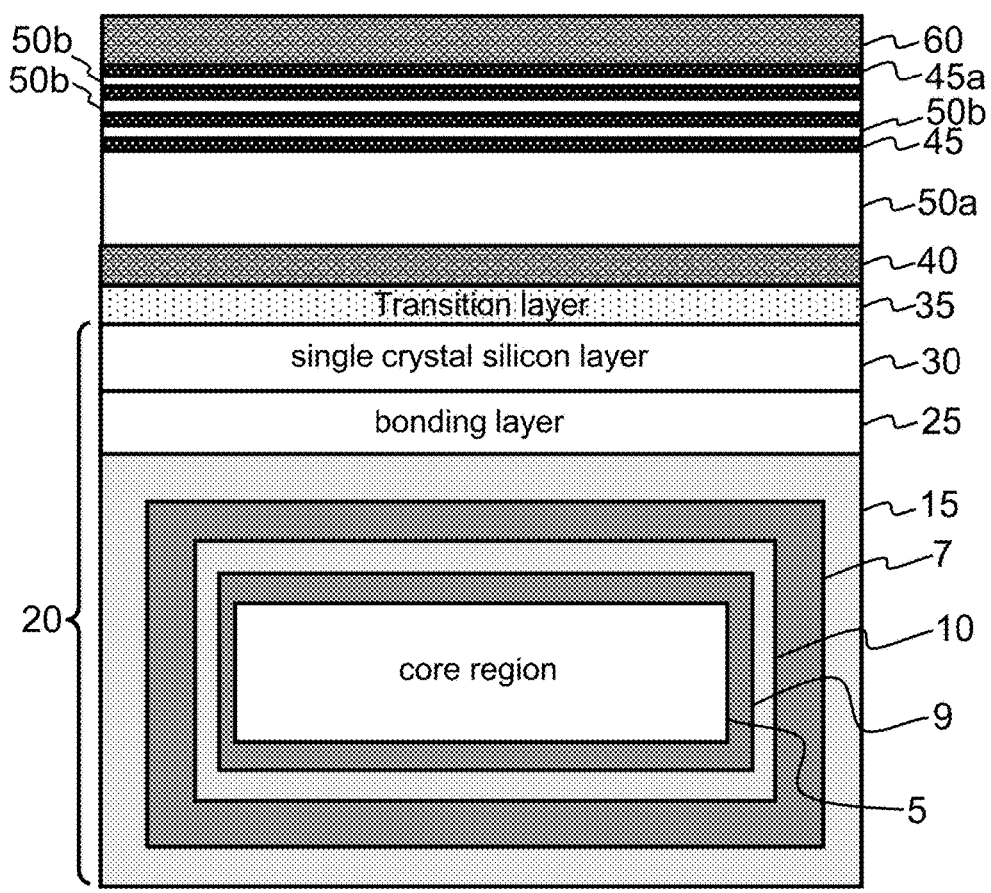

In step (c) as shown in FIGS. 7A~7E, a buffer layer 50 is epitaxially grown in a sequential manner on the transition layer 35 (forming multiple sublayers thereof), by first growing a u-GaN sublayer 50a (see FIG. 7A), followed by growing alternatively a plurality of C—(Al)GaN/u-GaN interlayers 45/50b (see FIGS. 7B~7D), and finally, as shown in FIG. 7E, by growing a first (topmost) C—(Al)GaN interlayer 45a on the u-GaN interlayers 50b. The C—(Al)GaN/u-GaN interlayers 45, 50b (multiple stacking layers) of the buffer layer 50 comprising at least one C—(Al)GaN interlayer 45 and at least one u-GaN interlayer 50b formed sequentially. The total thickness of all combined u-GaN sublayer 50a and u-GaN interlayer 50b in the buffer layer 50 together are larger than 5 µm, each u-GaN interlayer 50b in the buffer layer 50 is larger than 1 µm, and a thickness of each of the C—(Al)GaN interlayer 45 and the first C—(Al)GaN interlayer 45a is between 30 nm and 200 nm. A high temperature (e.g., 1,000° C.) epitaxial growth process under metal-organic chemical vapor deposition (MOCVD), molecular-beam epitaxy (MBE), hydride vapor phase epitaxy (HVPE), low pressure CVD (LPCVD), atomic layer deposition (ALD), physical vapor deposition (PVD) or the like, can be utilized for the epitaxial growth of the buffer layer 50, in which the at least one C—AlGaN interlayer 45 and the first C—(Al)GaN interlayer 45a are formed by introducing carbon tetrabromide ($CBr_4$) gas source in an in-situ manner during epitaxial growth (indicated using thick black arrowed lines as illustrated in FIGS. 7B and 7D). The u-GaN interlayer 50b is grown epitaxially on the C—(Al)GaN interlayer 45. During growth of the u-GaN layers 50a, 50b, for the buffer layer 50, the carbon tetrabromide ($CBr_4$) gas source is turned off inside the same chamber during steps of growing the u-GaN layers 50a, 50b. The epitaxial growth process of the first C—(Al)GaN interlayer 45a is the same as that of the C—(Al)GaN interlayer 45.

In step (d) as shown in FIG. 7E, a channel layer 60, which is an u-GaN material layer is epitaxially grown on the first C—(Al)GaN interlayer 45a. In the embodiment, the channel layer 60 is epitaxially formed and disposed on the first C—(Al)GaN interlayer 45a of the buffer layer 50 in an in-situ manner. The channel layer 60 is also made of u-GaN and has a thickness between 200 nm and 700 nm. The channel layer 60 is preferably undoped, but may be doped with various substances in order to modify electron concentration in sheet charge region (not shown) or the behavior of the conduction band $E_c$ and valence band $E_v$ in an area below the sheet charge region.

Figure 8:
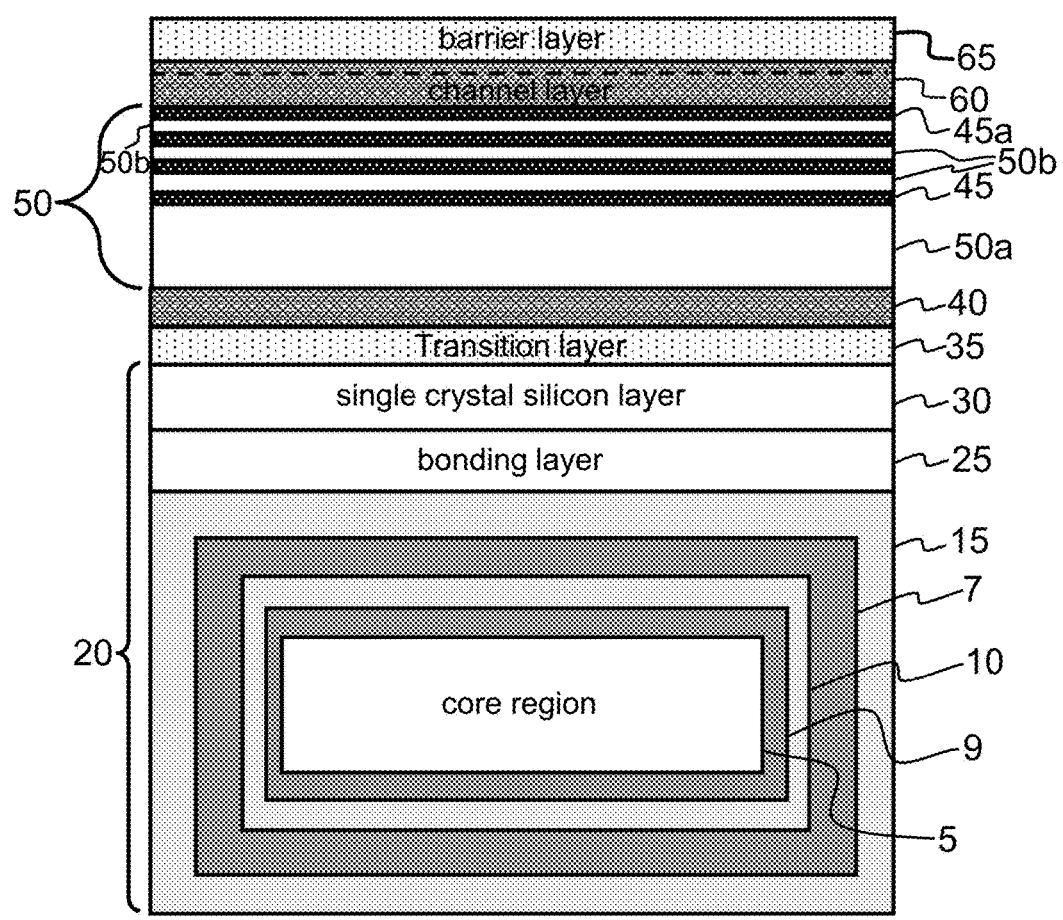
Figure 9:
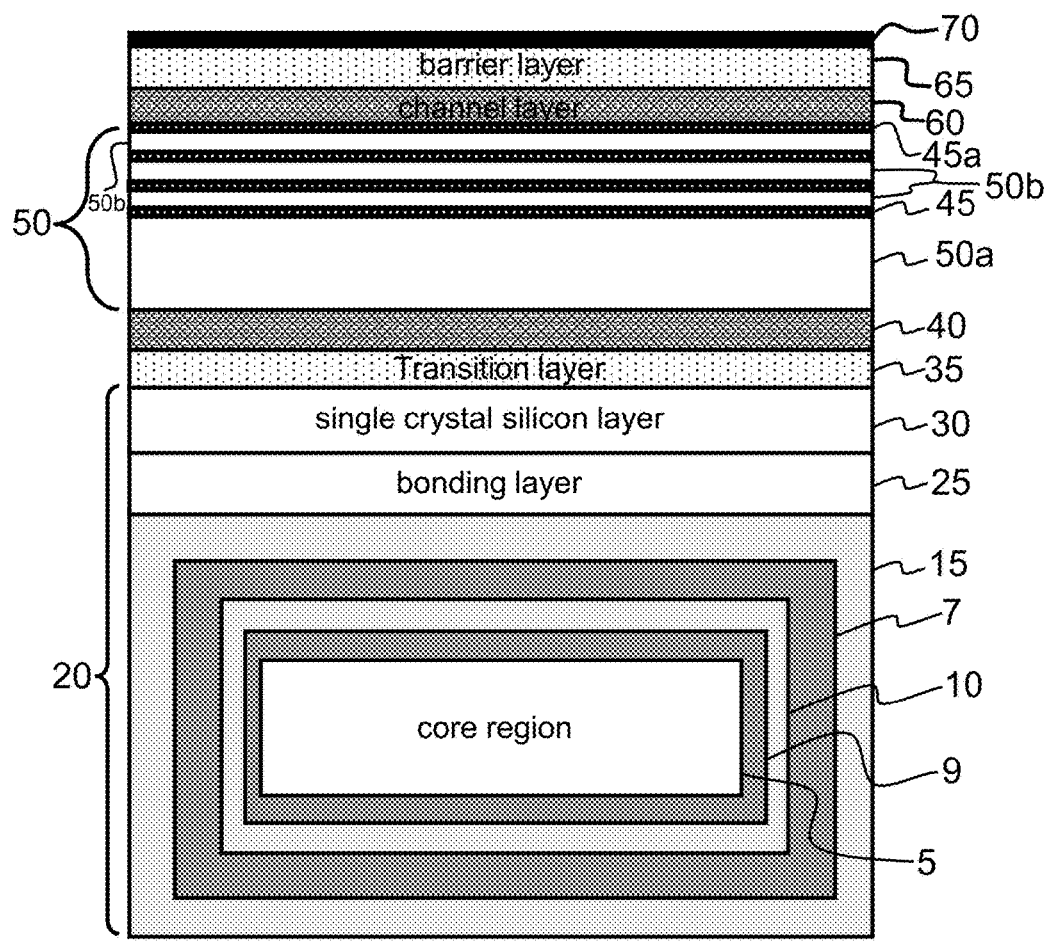

In step (e) as shown in FIG. 8, a barrier layer 65 is then epitaxially grown on the channel layer 60, in which the barrier layer 65 is made of AlGaN composition, with aluminum (Al) content from 20% to 28% and having a thickness between 18 nm and 30 nm. Preferably, the Al content of the barrier layer 65 is 25%. In an illustrated step shown in FIG. 9, a GaN cap layer 70 is grown on the barrier layer 65. The GaN cap layer 70 and the barrier layer 65 would then be patterned respectively for forming recesses (not shown) for placement of a source and a drain (not shown).

For example, an etching mask (not shown) may be formed on the GaN cap layer 70 and portions of the GaN cap layer 70 are removed, for example, by using a conventional etching process, to the barrier layer 65. However, other techniques, such as selective epitaxial growth may also be used. As shown in FIG. 1 for step (f), a source (electrode) 74 and a drain (electrode) 72 are formed on the exposed portions of the barrier layer 65 (filling the recesses previously being patterned) using conventional techniques. A gate (electrode) 80 is formed also on the GaN cap layer 70. The source-side sidewall of the gate contact is aligned with the source-side sidewall of the recess using conventional photolithographic techniques and mask alignment tools. The source 74 and the drain 72 can include titanium, aluminum, gold, nickel, platinum, or molybdenum. The gate 80 is formed between the source 74 and the drain 72, and a material of the gate 80 includes nickel, gold, tungsten, molybdenum, titanium nitride, titanium tungsten, platinum, or aluminum. The gate 80 functions as a control electrode for turning on/off the semiconductor power device 100. A shape of the gate (electrode) 80 can include a rectangle or a T-shape. The source (electrode) 74, the drain (electrode) 72, and the gate (electrode) 80 are functioned as terminals to electrically connect an external electronic device. As shown in FIG. 1, a passivation (not labelled) is formed to isolate the source 74, the drain 72, and the gate 80, respectively, as well as covering the GaN cap layer 70, and can be deposited on the GaN cap layer 70 by chemical vapor deposition (CVD).

Figure 10:
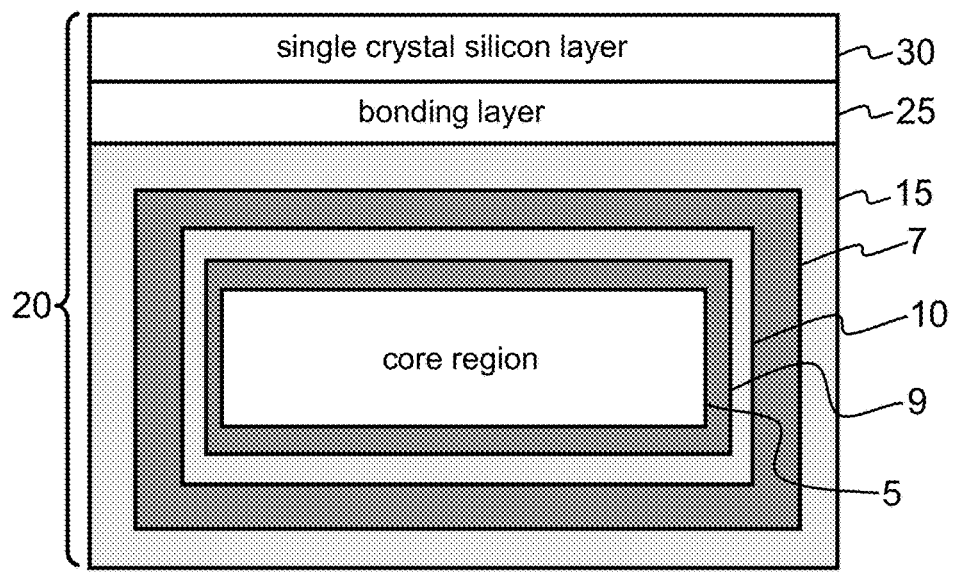
Figure 11:
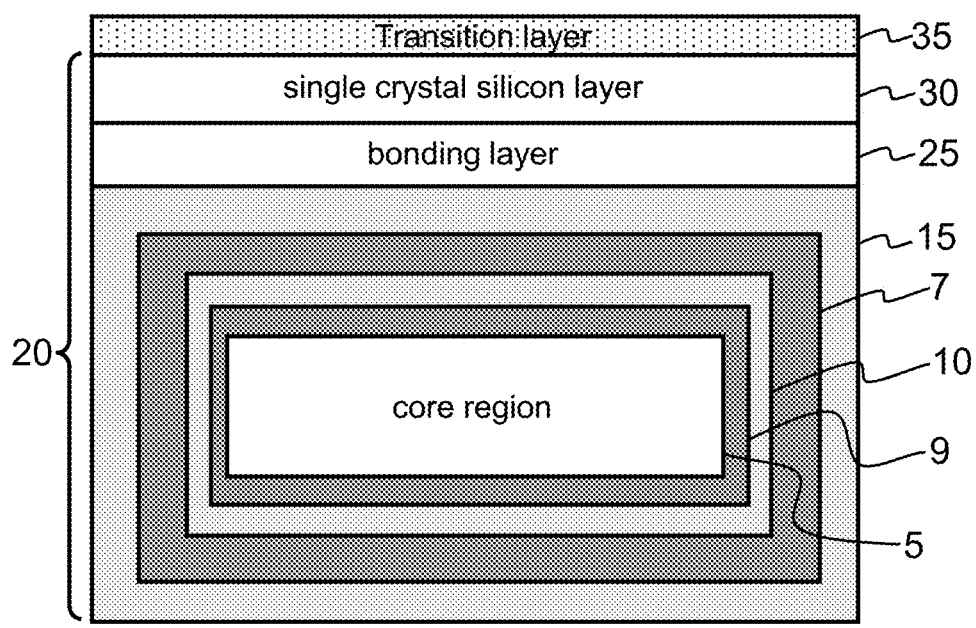
Figure 12:
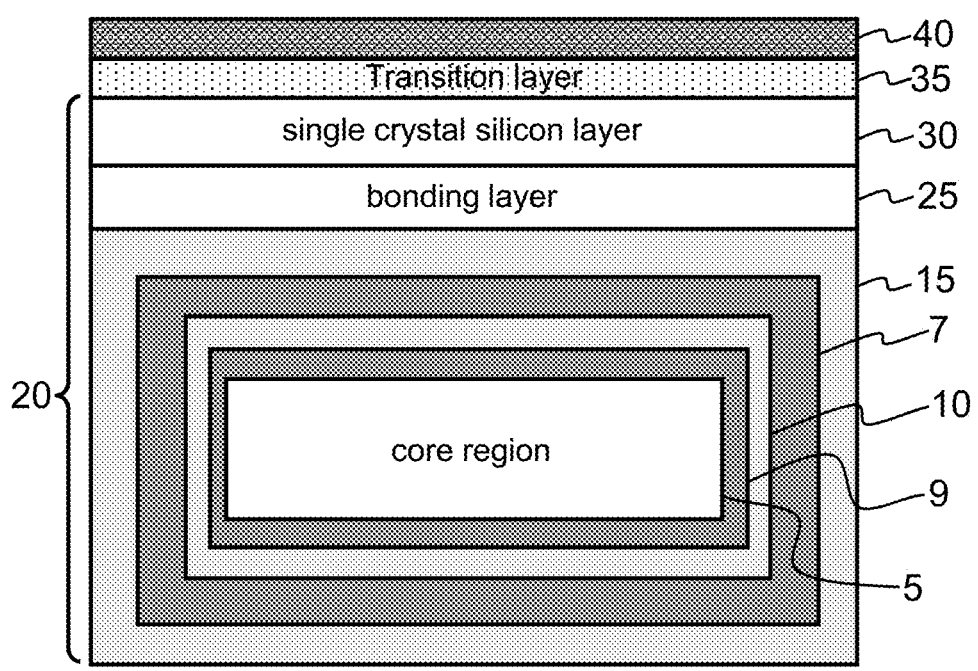
Figure 13:
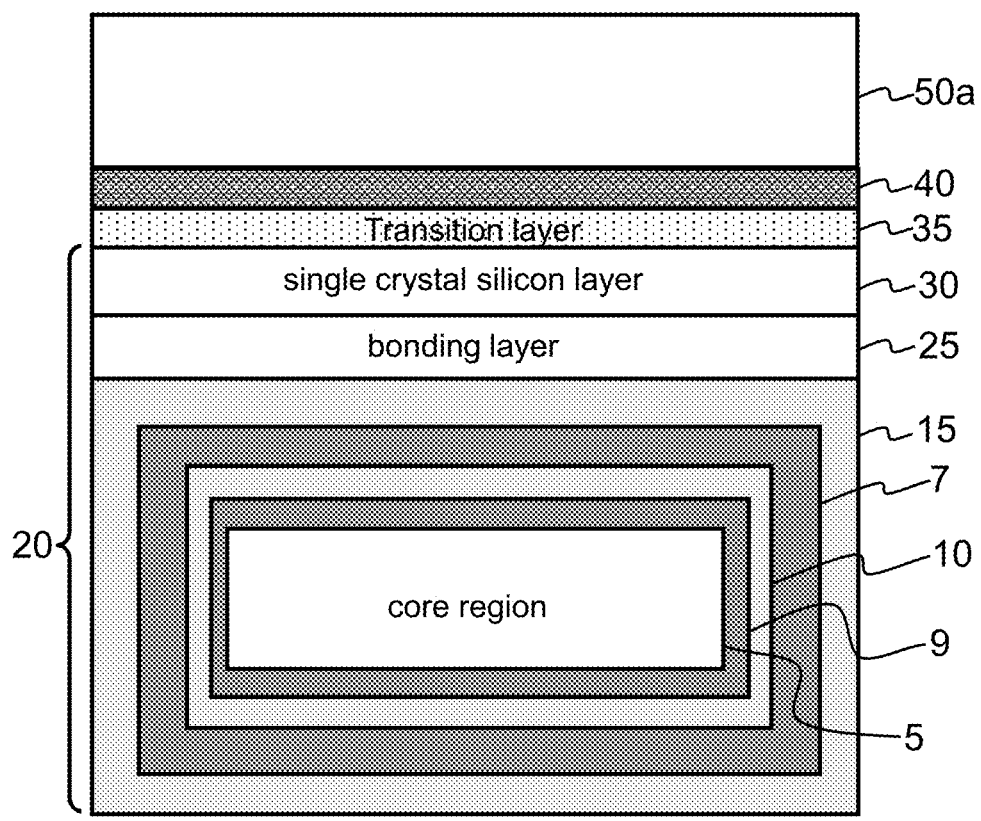

Referring to FIGS. 10-17, and FIG. 2, a method for fabricating a semiconductor power device 200 is shown. The semiconductor power device 200 is similar to the semiconductor power device 100. The difference between the semiconductor power device 200 and the semiconductor power device 100 is the semiconductor power device 200 includes the buffer layer 50 with only one u-GaN sublayer 50a and one C—(Al)GaN interlayer 45 on the u-GaN sublayer 50a. The method for fabricating the semiconductor power device 200 includes the following steps: In step (a) as shown in FIG. 10, an engineered substrate structure 20 is provided as an integral (turnkey) pre-fabricated structure, and is same as that of step (a) as shown in FIG. 4, thus omitted herein below for the sake of brevity. In step (b) as shown in FIG. 11, a transition layer 35 is grown on the engineered substrate structure 20 epitaxially, which is same as that of step (b) as shown in FIG. 5, thus omitted herein below for the sake of brevity. In an optional step in between step (b) and step (c), a $SiN_x$ interlayer 40 of about 100 nm in thickness can be deposited on the transition layer 35 as shown in FIG. 12 using plasma-enhanced chemical vapor deposition (PECVD). In step (c) as shown in FIG. 13, a buffer layer 50 is epitaxially grown on the transition layer 35, in which the buffer layer 50 comprising a u-GaN sublayer 50a and a thickness of the u-GaN sublayer 50a is larger than 5 µm. A high temperature (e.g., 1,000° C.) epitaxial growth process under metal-organic chemical vapor deposition (MOCVD), molecular-beam epitaxy (MBE), hydride vapor phase epitaxy (HVPE), low pressure CVD (LPCVD), atomic layer deposition (ALD), physical vapor deposition (PVD) or the like, can be utilized for the epitaxial growth of the u-GaN sublayer 50a in the buffer layer 50.

Figure 14:
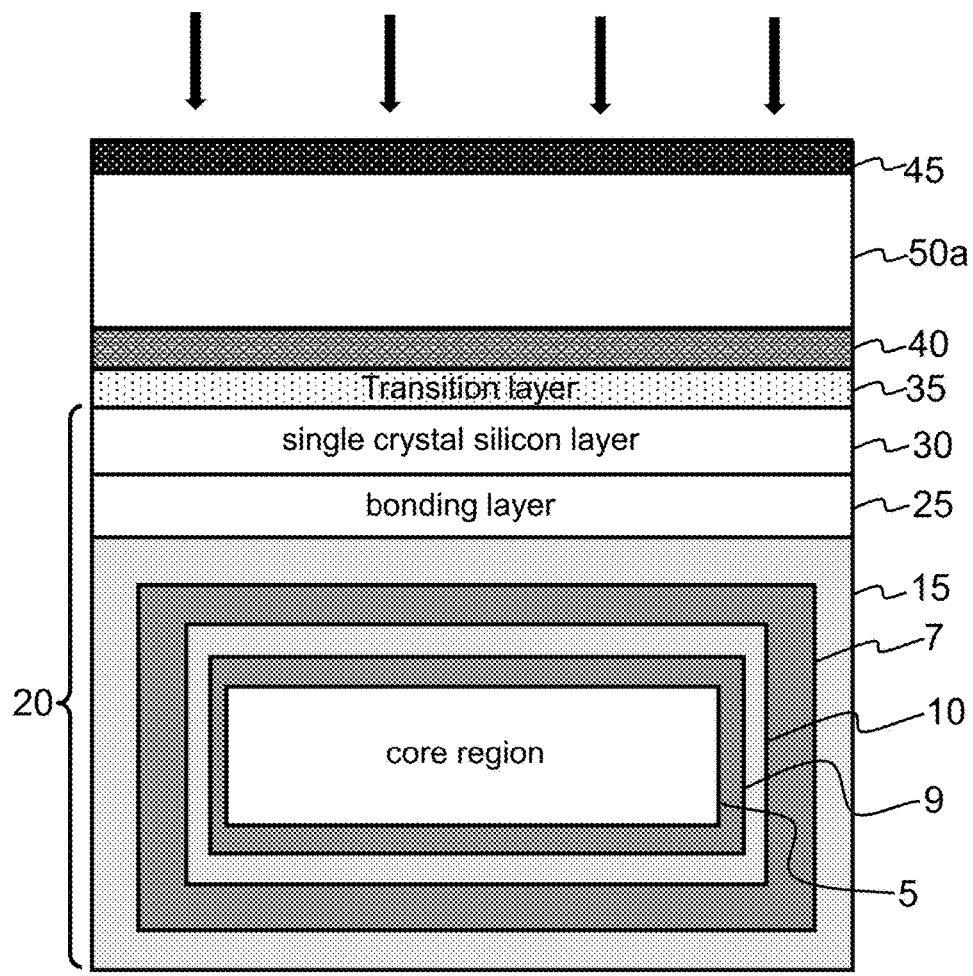

In the illustrated step shown in FIG. 14 which is directly following the step (c), one C—(Al)GaN interlayer 45 is grown epitaxially on the u-GaN sublayer 50a. The C—(Al)GaN interlayer 45 has a thickness from 30 nm to 200 nm. For example, the C—(Al)GaN interlayer 45 is formed by introducing carbon tetrabromide ($CBr_4$) gas source in an in-situ manner during epitaxial growth (indicated using thick black arrowed lines as illustrated in FIG. 14), while the carbon tetrabromide ($CBr_4$) gas source was turned off during growth of the u-GaN sublayer 50a of the buffer layer 50 inside the same chamber during step (c).

Figure 15:
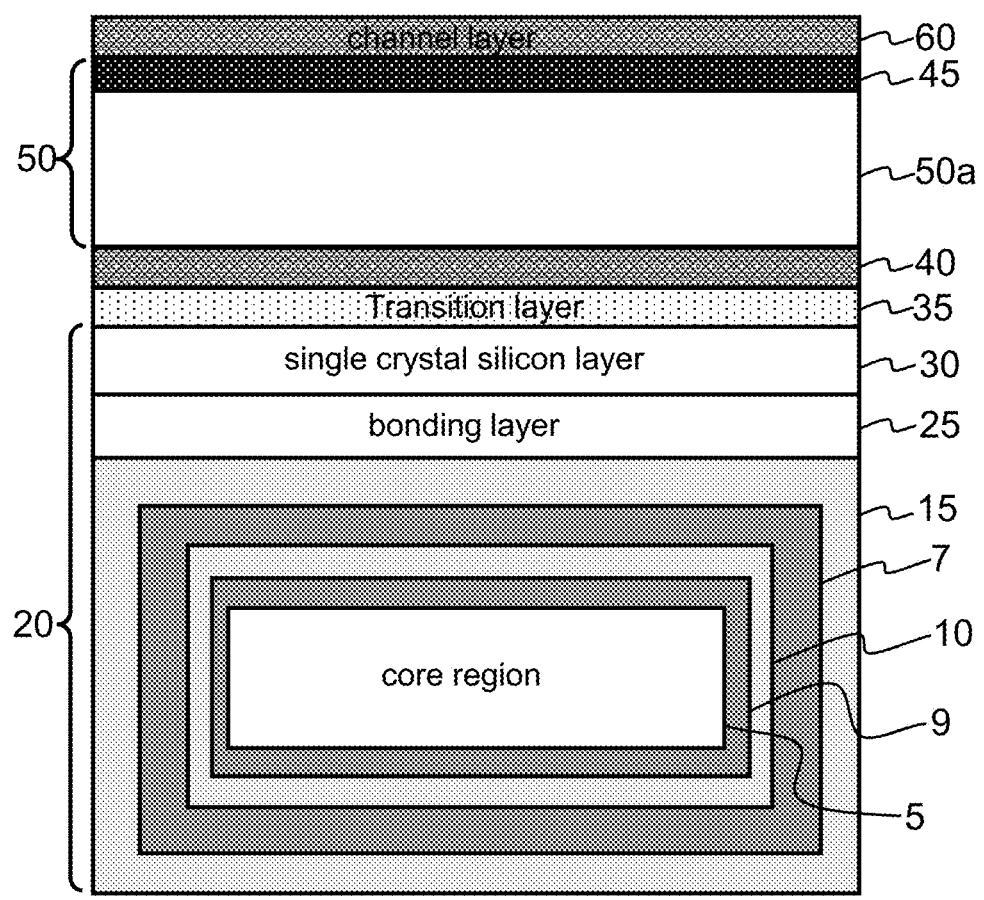

In step (d) as shown in FIG. 15, a channel layer 60 made of u-GaN and of has a thickness between 200 nm and 700 nm is epitaxially grown on the C—(Al)GaN interlayer 45. The channel layer 60 is preferably undoped, but may be doped with various substances in order to modify electron concentration in sheet charge region (not shown) or the behavior of the conduction band $E_c$ and valence band $E_v$ in an area below the sheet charge region.

Figure 16:
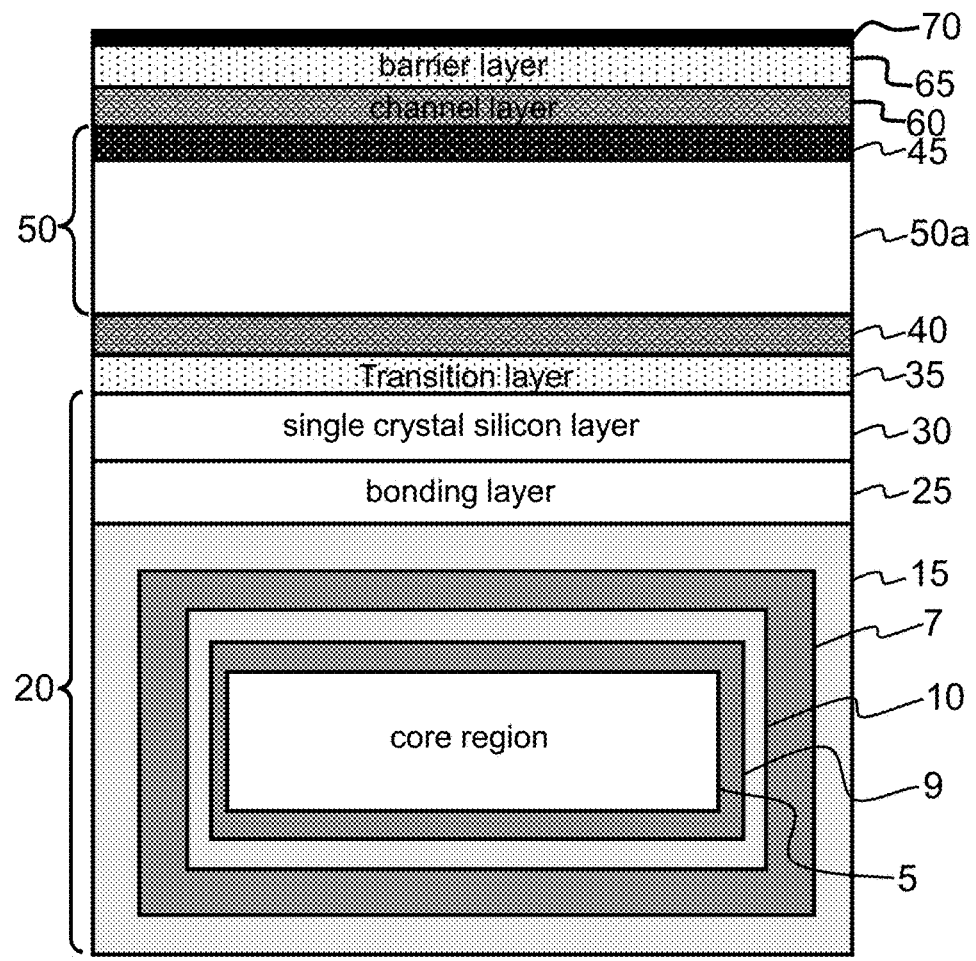

In step (e) as shown in FIG. 16, a barrier layer 65 is then epitaxially grown on the channel layer 60, in which the barrier layer 65 is of AlGaN composition, with aluminum (Al) content from 20% to 28% and having a thickness between 18 nm and 30 nm. Preferably, the Al content of the barrier layer 65 is 25%.

Figure 2:
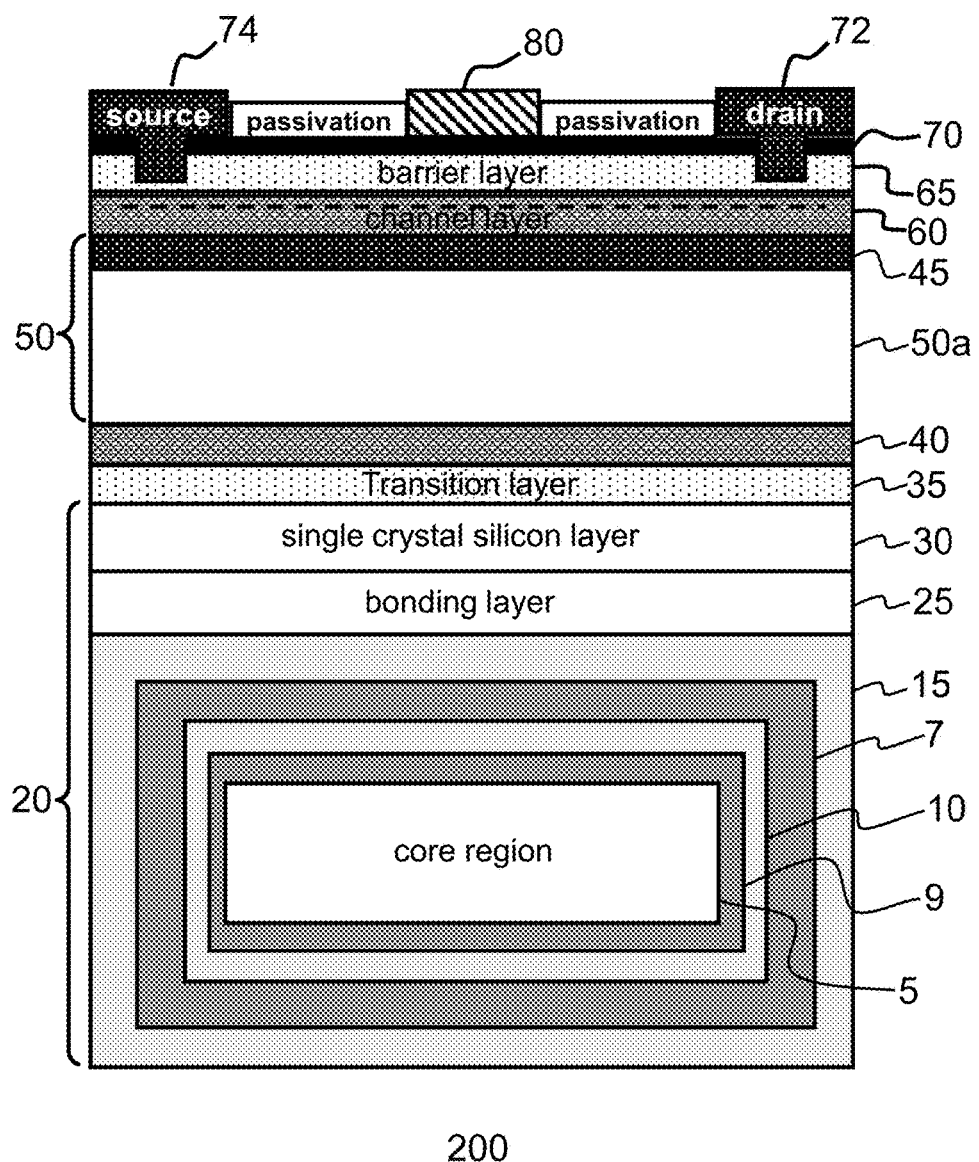
FIG. 2 is a cross-sectional view illustrating structural configuration of a semiconductor power device according to a second embodiment of the present invention.
Figure 17:
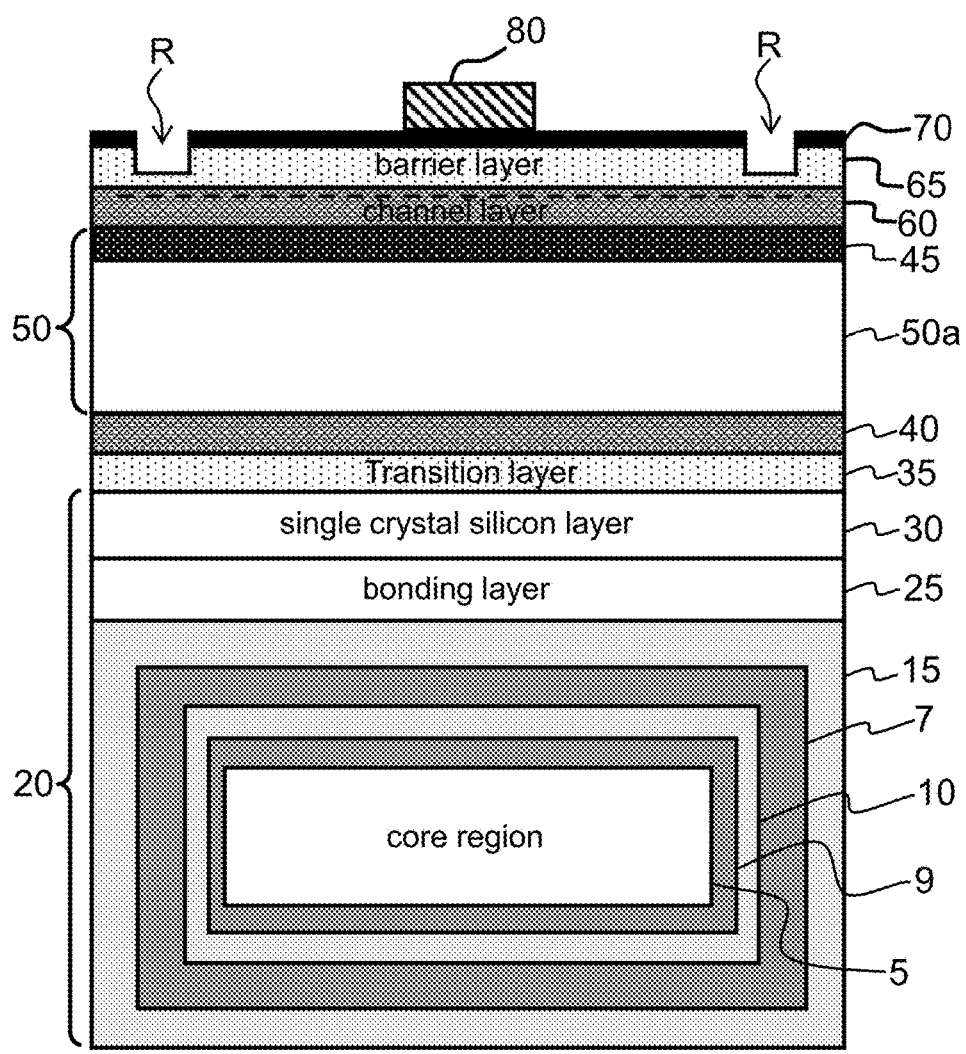

In an illustrated step shown also in FIG. 16, a GaN cap layer 70 is grown on the barrier layer 65. As shown in FIG. 17, after step (e) and before step (f), the GaN cap layer 70 and the barrier layer 65 are then patterned respectively for forming recesses R for placement of a source (not shown) and a drain (not shown). For example, an etching mask (not shown) may be formed on the GaN cap layer 70 and portions of the GaN cap layer 70 are removed by using a conventional etching process to the barrier layer 65. However, other techniques, such as selective epitaxial growth may also be used. Later, as shown in FIG. 2 corresponding to step (f), a source (electrode) 74 and a drain (electrode) 72 are formed on the exposed portions of the barrier layer 65 (filling the recesses R previously being patterned) using conventional techniques. A gate (electrode) 80 is formed also on the GaN cap layer 70 by physical vapor deposition (PVD) for example. The source-side sidewall of the gate contact is aligned with the source-side sidewall of the recess R using conventional photolithographic techniques and mask alignment tools. The source 74 and the drain 72 can include titanium, aluminum, gold, nickel, platinum, or molybdenum. The gate 80 is formed between the source 74 and the drain 72, and a material of the gate 80 includes nickel, gold, tungsten, molybdenum, titanium nitride, titanium tungsten, platinum, or aluminum. The gate 80 functions as a control electrode for turning on/off the semiconductor power device 200. A shape of the gate (electrode) 80 can include a rectangle or a T-shape. The source (electrode) 74, the drain (electrode) 72, and the gate (electrode) 80 are functioned as terminals to electrically connect an external electronic device.

As shown in FIG. 2, a passivation (not labelled) is formed to isolate and prevent current leakage problem between the source 74, the drain 72, and the gate 80 as well as forming a protective layer covering the GaN cap layer 70 to prevent moisture from entering, and can be deposited on the GaN cap layer 70 by chemical vapor deposition (CVD).

Figure 3:
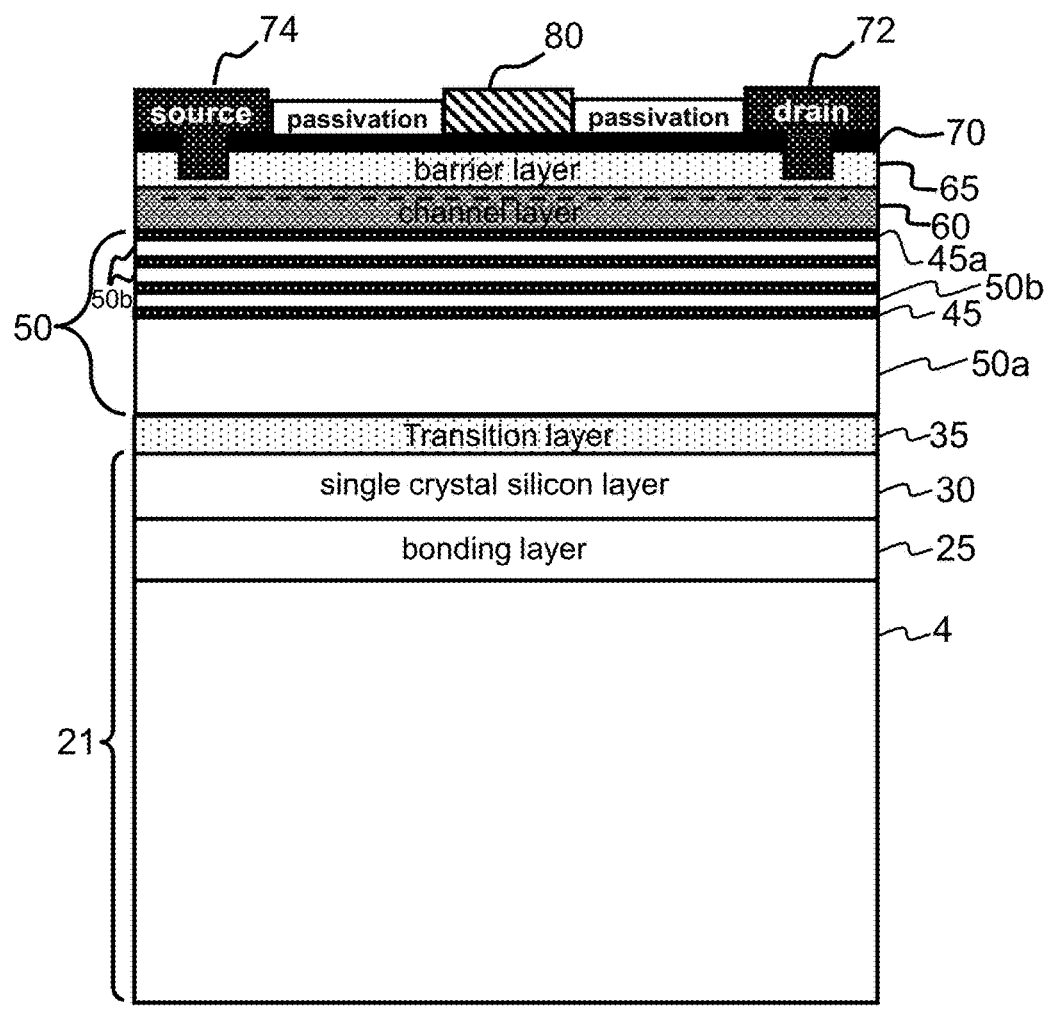
FIG. 3 is a cross-sectional view illustrating structural configuration of a semiconductor power device according to a third embodiment of the present invention.

As shown in FIG. 3, a third embodiment of a semiconductor power device 300 according to the present invention having a simplified version of a substrate structure 21, which has a substrate 4 instead of the multi-layers 9, 10, 7, 15, the core region 5 and the encapsulated core region 5 of the engineered substrate structure 20, is described. The substrate 4 is made of single crystalline aluminum nitride (AlN) or a ceramic material, for example, such as polycrystalline AlN, which can include a binding material such as yttrium oxide. Other materials can be utilized in the core region, including gallium nitride (GaN), aluminum gallium nitride (AlGaN), silicon carbide (SiC), zinc oxide (ZnO), gallium trioxide ($Ga_2O_3$), and the like. Other remaining material layers and manufacturing steps are substantially the same as those of other embodiments of instant disclosure inclusive of the semiconductor power devices 100, 200, and are thus omitted for brevity.

The fabricated semiconductor power devices 100, 200, 300 in the illustrated embodiments of FIGS. 1-3 can be configured in normally-off mode operation. However, alternatively, normally-on mode can also be adapted.

In the methods for fabricating the semiconductor power devices 100, 200, 300, the transition layer 35, the buffer layer 50, the channel layer 60, and the barrier layer 65 can be grown by physical vapor deposition (PVD), atomic layer deposition (ALD), (metal-organic chemical vapor deposition, MOCVD), molecular-beam epitaxy (MBE), or hydride vapor phase epitaxy (HVPE). In alternative embodiment, the transition layer 35 can have a plurality of group III-nitride layers having graded composition, the buffer layer 50 can have a first group IIIA-VA compound semiconductor material and a carbon-doped first group IIIA-VA compound semiconductor material, the channel layer 60 can have the first group IIIA-VA compound semiconductor material, the barrier layer 65 can have a second group IIIA-VA compound semiconductor material. The carbon-doped first group IIIA-VA compound semiconductor material in the buffer layer 50 comprises a plurality of carbon-doped first group IIIA-VA interlayers disposed in the buffer layer 50.

For alternative embodiment, the substrate structure 20, 21 can include a group III nitride substrate. In one embodiment, the core region 5 of the substrate structure 20 or the substrate 4 of the substrate structure 21 include the group III nitride substrate. The group III nitride substrate of the substrate structure includes gallium nitride (GaN), aluminum nitride (AlN), indium nitride (InN), aluminum-gallium nitride (AlGaN), aluminum indium nitride (AlInN), indium-gallium-aluminum nitride (InGaAlN), or the combination thereof.

According to the embodiments of the semiconductor power device of instant disclosure, an engineered substrate structure in combination with a transition layer disposed on the engineered substrate structure, a buffer layer disposed on the transition layer and having a channel layer disposed thereon, and with a barrier layer disposed on the channel layer together formed an improved power device structural configuration. Due to the performance improvements or advantages achieved by presence of the engineered substrate structure comprising a core region made of aluminum nitride (AlN) and a single crystal silicon layer disposed as being top material layer thereof, together with the buffer layer comprising C—AlGaN interlayers disposed within an u-GaN layer, a transition layer disposed on the engineered substrate structure, and having an optional $SiN_x$ interlayer, to be respectively disposed and configured in the finished power semiconductor device, embodiments of the semiconductor power device of instant disclosure thereby provide substantial utility.

It is believed that the present embodiments and their advantages will be understood from the foregoing description, and it will be apparent that various changes may be made thereto without departing from the spirit and scope of the embodiments or sacrificing all of its material advantages.

What is claimed is:

1. A semiconductor power device, comprising:
an engineered substrate structure;
a transition layer disposed on the engineered substrate structure;
a buffer layer disposed on the transition layer;
a channel layer formed on the buffer layer;
a barrier layer disposed on the channel layer; and
a gate, a source and a drain;
wherein the engineered substrate structure comprises a core region of a substrate; a thin film layer disposed on the core region; a bonding layer coupled to at least a portion of the thin film layer; an adhesive layer disposed between the core region and the thin film layer; and a single crystal silicon layer coupled to the bonding layer; and
wherein the buffer layer comprises an undoped gallium nitride (u-GaN) layer and a plurality of carbon-doped (aluminum) gallium nitride based (C—(Al)GaN) interlayers disposed within the u-GaN layer; a total thickness of the u-GaN layer of the buffer layer is larger than 5 µm; a thickness of each of the C—(Al)GaN interlayers is between 30 nm and 200 nm; and the gate, the source and the drain are disposed above the barrier layer, respectively.

2. The semiconductor power device of claim 1, wherein the transition layer is a constant-composition epitaxial layer of aluminum gallium nitride ($Al_xGa_{1-x}N$), and wherein $0 \leq X \leq 1$.

3. The semiconductor power device of claim 1, wherein the transition layer is a graded-composition epitaxial layer comprising aluminum gallium nitride ($Al_{x1}Ga_{1-x1}N$) and aluminum gallium nitride ($Al_{x2}Ga_{1-x2}N$) sublayers, and wherein $0 < X1, X2 \leq 1$.

4. The semiconductor power device of claim 1, wherein the engineered substrate structure has a thickness larger than 600 µm, the transition layer has a thickness less than 500 nm.

5. The semiconductor power device of claim 1, wherein the total thickness of the u-GaN layer of the buffer layer is between 5 µm and 12 µm, and the channel layer has a thickness between 200 nm and 700 nm.

6. The semiconductor power device of claim 1, wherein the substrate in the core region of the engineered substrate structure is made of aluminum nitride (AlN).

7. The semiconductor power device of claim 1, further comprising a silicon nitride ($SiN_x$) interlayer disposed between the buffer layer and the transition layer.

8. The semiconductor power device of claim 1, further comprising a GaN cap layer having a thickness between 1 nm and 3 nm disposed on the barrier layer; wherein the barrier layer is made of aluminum gallium nitride (AlGaN) with an aluminum (Al) composition content between 20% and 28%, and has a thickness between 18 nm and 30 nm.

9. The semiconductor power device of claim 1, wherein the C—(Al)GaN interlayers disposed within the buffer layer include a first carbon-doped (aluminum) gallium nitride based (C—(Al)GaN) interlayer disposed nearest to a top surface of the buffer layer.

10. The semiconductor power device of claim 9, wherein a distance from a bottom surface of the barrier layer to the top surface of the first C—(Al)GaN interlayer is between 200 nm and 700 nm.

11. The semiconductor power device of claim 1, wherein a carbon doping concentration of the C—(Al)GaN interlayers is greater than 1E18 atoms/$cm^3$.

12. The semiconductor power device of claim 1, wherein a distance between any two adjacent of the C—(Al)GaN interlayers is larger than 1 µm.

13. A semiconductor power device, comprising:
a substrate structure;
a transition layer disposed on the substrate structure and comprising a plurality of group III-nitride layers having graded composition;

a buffer layer disposed on the transition layer and comprising a first group IIIA-VA compound semiconductor material and a carbon-doped first group IIIA-VA compound semiconductor material;

a channel layer disposed on the buffer layer and comprising the first group IIIA-VA compound semiconductor material;

a barrier layer disposed on the channel layer and comprising a second group IIIA-VA compound semiconductor material; and a gate, a source, and a drain disposed on the barrier layer, respectively;

wherein the substrate structure comprises a group III nitride substrate; a bonding layer coupled to the group III nitride substrate; and a single crystal silicon layer coupled to the bonding layer; and wherein the carbon-doped first group IIIA-VA compound semiconductor material in the buffer layer comprises a plurality of carbon-doped first group IIIA-VA interlayers disposed in the buffer layer.

14. The semiconductor power device of claim 13, wherein the group III nitride substrate of the substrate structure comprises gallium nitride (GaN), aluminum nitride (AlN), indium nitride (InN), aluminum-gallium nitride (AlGaN), aluminum indium nitride (AlInN), indium-gallium-aluminum nitride (InGaAlN), or the combination thereof.

* * * * *